US012142896B2

(12) United States Patent
Schreck et al.

(10) Patent No.: US 12,142,896 B2
(45) Date of Patent: Nov. 12, 2024

(54) PREHEATING LASER DIODES WITH REVERSE BIAS FOR HAMR DISK DRIVES (71) Applicant: Western Digital Technologies, Inc., San Jose, CA (US)

(72) Inventors: Erhard Schreck, San Jose, CA (US); Sukumar Rajauria, San Jose, CA (US); Robert Smith, Washington, DC (US); Joey M. Poss, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/447,401

(22) Filed: Aug. 10, 2023

(65) Prior Publication Data
US 2024/0170915 A1  May 23, 2024

Related U.S. Application Data (60) Provisional application No. 63/426,176, filed on Nov. 17, 2022.

(51) Int. Cl.
G11B 5/00 (2006.01)
G11B 5/03 (2006.01)
H01S 5/024 (2006.01)
H01S 5/065 (2006.01)

(52) U.S. Cl.
CPC ............. *H01S 5/0651* (2013.01); *G11B 5/03* (2013.01); *H01S 5/02453* (2013.01); *G11B 2005/0021* (2013.01)

(58) Field of Classification Search
CPC ......... G11B 5/02; G11B 5/1218; G11B 5/235; G11B 5/314; G11B 5/3146; G11B 5/3113; G11B 2005/0024; G11B 5/03; G11B 20/0013
USPC ................................................ 360/59, 46, 66
See application file for complete search history.

(56) References Cited

U.S. PATENT DOCUMENTS

| | | | | |
|---|---|---|---|---|
| 9,905,996 | B2 * | 2/2018 | Wessel | G11B 19/046 |
| 10,410,668 | B1 * | 9/2019 | Macken | G11B 5/09 |
| 2012/0300599 | A1 | 11/2012 | Contreras et al. | |
| 2013/0141818 | A1 | 6/2013 | Sinclair et al. | |
| 2016/0189741 | A1 | 6/2016 | Tatah et al. | |
| 2022/0189504 | A1 | 6/2022 | Oberg et al. | |

OTHER PUBLICATIONS

Yang, Jeong Rok, International Search Report and Written Opinion issued in PCT/US2023/076012, Feb. 1, 2024, pp. 9.

* cited by examiner

*Primary Examiner* — Nabil Z Hindi
(74) *Attorney, Agent, or Firm* — Neugeboren O'Dowd PC (57) ABSTRACT A data storage device may include one or more disks, an actuator arm assembly comprising one or more disk heads, at least one laser diode positioned inside a corresponding laser diode cavity, a preamplifier, and one or more processing devices. The one or more processing devices are configured to: generate a reverse bias; apply, using the preamplifier, the reverse bias to the at least one laser diode to preheat a corresponding laser diode cavity to a target temperature prior to a write operation; control transition of the preamplifier from applying the reverse bias to applying a forward bias to the at least one laser diode; and activate the at least one laser diode to begin the write operation.

20 Claims, 9 Drawing Sheets

PREHEATING LASER DIODES WITH REVERSE BIAS FOR HAMR DISK DRIVES

CLAIM OF PRIORITY UNDER 35 U.S.C. § 120

The present Application for Patent claims priority to Provisional Application No. 63/426,176 entitled "PREHEATING LASER DIODES WITH REVERSE BIAS FOR HAMR DISK DRIVES" filed Nov. 17, 2022, and assigned to the assignee hereof and hereby expressly incorporated by reference herein.

BACKGROUND

Data storage devices such as disk drives comprise one or more disks, and one or more read/write heads connected to distal ends of actuator arms, which are rotated by actuators (e.g., a voice coil motor, one or more fine actuators) to position the heads radially over surfaces of the disks, at carefully controlled fly heights over the disk surfaces. The disk surfaces each comprise a plurality of radially spaced, concentric tracks for recording user data sectors and servo wedges or servo sectors. The servo tracks are written on previously blank disk drive surfaces as part of the final stage of preparation of the disk drive. The servo sectors comprise head positioning information (e.g., a track address) which is read by the heads and processed by a servo control system to control the actuator arms as they seek from track to track.

Figure 1A:
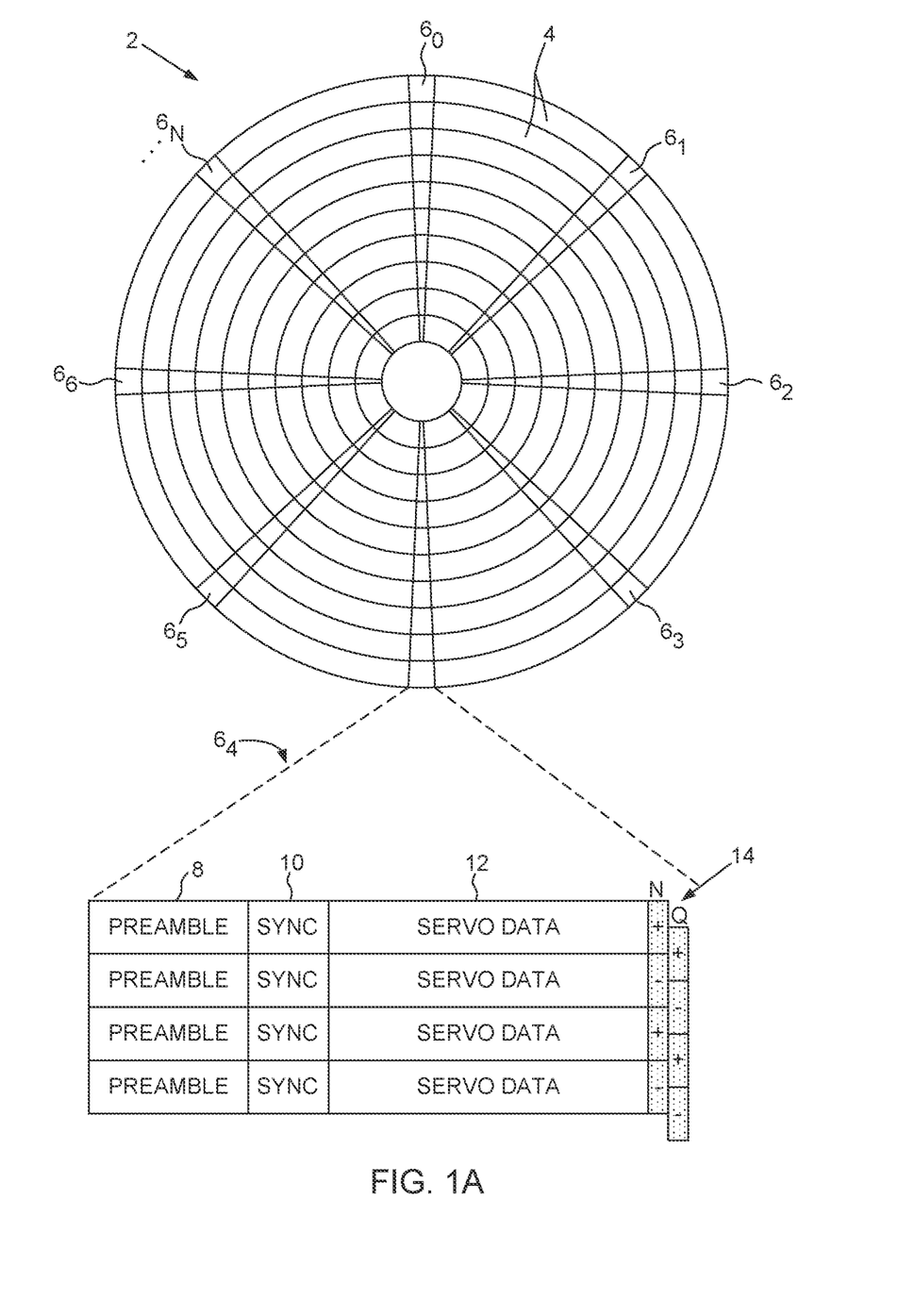
FIG. 1A shows a disk format as comprising a number of radially-spaced, concentric servo tracks defined by servo wedges recorded around the circumference of each servo track, according to various aspects of the present disclosure.

FIG. 1A shows a prior art disk format 2 as comprising a number of radially-spaced, concentric servo tracks 4 defined by servo wedges $6_0$-$6_N$ recorded around the circumference of each servo track. A plurality of concentric data tracks are defined relative to the servo tracks 4, wherein the data tracks may have the same or a different radial density (e.g., tracks per inch (TPI)) than the servo tracks 6. Each servo wedge $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo wedge (e.g., servo wedge $6_4$) further comprises groups of phase-based servo bursts 14 (e.g., N and Q servo bursts), which are recorded with a predetermined phase relative to one another and relative to the servo track centerlines.

The coarse head position information is processed to position a head over a target data track during a seek operation, and the servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to the one or more actuators in order to actuate the head radially over the disk in a direction that reduces the PES.

The description provided in the background section should not be assumed to be prior art merely because it is mentioned in or associated with the background section. The background section may include information that describes one or more aspects of the subject technology.

SUMMARY

The following presents a summary relating to one or more aspects and/or embodiments disclosed herein. The following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

In some cases, laser diodes in Heat Assisted Magnetic Recording (HAMR) drives are susceptible to temperature-induced mode hopping, for instance, during the start of a write operation. During HAMR write, the temperature of a laser diode may increase (e.g., by 10-20 degrees C.), and several mode hop critical temperatures may be crossed during this temperature transient. In some circumstances, one or more mode hop events may be triggered during this transient phase, which may adversely impact write performance. For example, mode hop events during a HAMR write operation may result in recording non-uniformities, which degrades HAMR recording performance. Broadly, aspects of the present disclosure are directed to preventing or reducing mode hops, which serves to enhance HAMR recording performance. In some embodiments, preheating a laser diode cavity to a target temperature (i.e., temperature used during the write operation) may help eliminate or minimize the temperature transient, as described in further detail below.

In some aspects, the techniques described herein relate to a data storage device, including: one or more disks, an actuator arm assembly including one or more magnetic recording heads, at least one laser diode, each of the at least one laser diode positioned inside a corresponding laser diode cavity, a preamplifier, and one or more processing devices. The one or more processing devices are configured to: generate a reverse bias; apply, using the preamplifier, the reverse bias to the at least one laser diode to preheat a corresponding laser diode cavity to a target temperature prior to a write operation; control transition of the preamplifier from applying the reverse bias to the at least one laser diode to applying a forward bias to the at least one laser diode; and activate a magnetic recording head corresponding to the at least one laser diode to begin the write operation.

In some aspects, the techniques described herein relate to a data storage device, wherein the preamplifier further includes a reverse bias power control circuit coupled to the at least one laser diode and configured to apply the reverse bias to the at least one laser diode.

In some aspects, the techniques described herein relate to a data storage device, wherein one or more of: no laser light is emitted when the reverse bias is applied to the at least one laser diode, no data writing or overwriting occurs when the reverse bias is applied to the at least one laser diode, and a temperature of a corresponding laser diode cavity is configured to stay the same or substantially the same after controlling the transition from the reverse bias to the forward bias for the at least one laser diode.

In some aspects, the techniques described herein relate to a data storage device, wherein each of the at least one laser diode dissipates a first power during the preheating, and wherein each of the at least one laser diode dissipates a second power during the write operation.

In some aspects, the techniques described herein relate to a data storage device, wherein one of: the first power is the same or substantially the same as the second power, or the first power is greater than the second power.

In some aspects, the techniques described herein relate to a data storage device, wherein one or more mode hops related to temperature transients at or near a start of the write operation are avoided based at least in part on preheating a corresponding laser diode cavity to the target temperature.

In some aspects, the techniques described herein relate to a data storage device, wherein the target temperature includes a steady-state temperature associated with the write operation and when the at least one laser diode is in a lasing state.

In some aspects, the techniques described herein relate to a data storage device, wherein the one or more processing devices are further configured to: maintain one or more of the at least one laser diode and a corresponding laser diode cavity in a preheat state such that a laser-on transition time is kept below a threshold.

In some aspects, the techniques described herein relate to a data storage device, wherein applying the reverse bias includes applying a negative voltage, and wherein a value of the negative voltage is kept below an avalanche or breakdown voltage for the at least one laser diode.

In some aspects, the techniques described herein relate to a method of operating a data storage device, the method including: generating a reverse bias; applying, by a preamplifier, the reverse bias to at least one laser diode of the data storage device to preheat at least one laser diode cavity to a target temperature prior to a write operation on one or more disks, wherein each of the at least one laser diode is positioned inside a corresponding laser diode cavity; controlling transition of the preamplifier from applying the reverse bias to the at least one laser diode to applying a forward bias to the at least one laser diode; and activating a magnetic recording head corresponding to the at least one laser diode to begin the write operation.

In some aspects, the techniques described herein relate to a method, wherein one or more of (1) no laser light is emitted when the reverse bias is applied to the at least one laser diode, (2) no data writing or overwriting occurs when the reverse bias is applied to the at least one laser diode, and (3) a temperature of a corresponding laser diode cavity is configured to stay the same or substantially the same after controlling the transition from the reverse bias to the forward bias for the at least one laser diode.

In some aspects, the techniques described herein relate to a method of operating a data storage device, further comprising (1) selecting a first power, wherein the first power corresponds to a power dissipated by each of the at least one laser diode during the preheating and when in a non-lasing state, and (2) selecting a second power, wherein the second power corresponds to a power dissipated by each of the at least one laser diode during the write operation and when in a lasing state.

In some aspects, the techniques described herein relate to a method of operating a data storage device, wherein one of: the first power is the same or substantially the same as the second power; or the first power is greater than the second power.

In some aspects, the techniques described herein relate to a method of operating a data storage device, wherein one or more mode hops related to temperature transients at a start of the write operation are avoided based at least in part on preheating a corresponding laser diode cavity to the target temperature.

In some aspects, the techniques described herein relate to a method of operating a data storage device, wherein the target temperature includes a steady-state temperature associated with the write operation and when the at least one laser diode is in a lasing state.

In some aspects, the techniques described herein relate to a method of operating a data storage device, further including maintaining one or more of the at least one laser diode and a corresponding laser diode cavity in a preheat state such that a laser-on transition time is kept below a threshold.

In some aspects, the techniques described herein relate to a method of operating a data storage device, wherein applying the reverse bias includes applying a negative voltage, and wherein a value of the negative voltage is kept below an avalanche or breakdown voltage for the at least one laser diode.

In some aspects, the techniques described herein relate to a method of operating a data storage device, wherein the preamplifier includes a reverse bias power control circuit coupled to the at least one laser diode and configured to apply the reverse bias to the at least one laser diode, and wherein the preamplifier further includes one or more multiplexers for isolating the at least one laser diode during application of the reverse bias.

In some aspects, the techniques described herein relate to one or more processing devices including: means for generating a reverse bias; means for applying the reverse bias to at least one laser diode of a data storage device to preheat at least one laser diode cavity to a target temperature prior to a write operation on one or more disks, wherein each of the at least one laser diode is positioned inside a corresponding laser diode cavity; means for controlling transition from applying the reverse bias to the at least one laser diode to applying a forward bias to the at least one laser diode; and means for activating a magnetic recording head corresponding to the at least one laser diode to begin the write operation.

In some aspects, the techniques described herein relate to one or more processing devices, wherein the data storage device includes a heat assisted magnetic recording (HAMR) data storage device, and wherein one or more of: no laser light is emitted when the reverse bias is applied to the at least one laser diode, no data writing or overwriting occurs when the reverse bias is applied to the at least one laser diode, and a temperature of a corresponding laser diode cavity is configured to stay the same or substantially the same after controlling the transition from the reverse bias to the forward bias for the at least one laser diode.

In some aspects, the techniques described herein relate to one or more processing devices, further including: means for selecting a first power, wherein the first power corresponds to a power dissipated by each of the at least one laser diode during the preheating and when in a non-lasing state; and means for selecting a second power, wherein the second power corresponds to a power dissipated by each of the at least one laser diode during the write operation and when in a lasing state. In some implementations, the first power is the same or substantially the same as the second power, or the first power is greater than the second power.

In some aspects, the techniques described herein relate to one or more processing devices, wherein the means for applying the reverse bias includes means for applying a negative voltage. In some implementations, a value of the negative voltage is at or below an avalanche or breakdown voltage for the at least one laser diode.

In some implementations, one or more mode hops related to temperature transients at or near the start of the write operation are avoided based at least in part on preheating a corresponding laser diode cavity to the target temperature.

In some implementations, the target temperature includes a steady-state temperature associated with the write operation and when the at least one laser diode is in a lasing state.

Various further aspects are depicted in the accompanying figures and described below and will be further apparent based thereon.

BRIEF DESCRIPTION OF THE DRAWINGS

Various features and advantages of the technology of the present disclosure will be apparent from the following description of particular examples of those technologies, and as illustrated in the accompanying drawings. The drawings are not necessarily to scale; the emphasis instead is placed on illustrating the principles of the technological concepts. In the drawings, like reference characters may refer to the same parts throughout the different views. The drawings depict only illustrative examples of the present disclosure and are not limiting in scope.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The embodiments described below are not intended to limit the invention to the precise form disclosed, nor are they intended to be exhaustive. Rather, the embodiment is presented to provide a description so that others skilled in the art may utilize its teachings. Technology continues to develop, and elements of the described and disclosed embodiments may be replaced by improved and enhanced items, however the teaching of the present disclosure inherently discloses elements used in embodiments incorporating technology available at the time of this disclosure.

In some cases, laser diodes in Heat Assisted Magnetic Recording (HAMR) drives are susceptible to temperature-induced mode hopping, for instance, during the start of a write operation. During HAMR write, the temperature of a laser diode may increase (e.g., by 10-20 degrees C.), and several mode hop critical temperatures may be crossed during this temperature transient. In some circumstances, one or more mode hop events may be triggered during this transient phase, which may adversely impact write performance. For example, mode hop events during a HAMR write operation may result in non-uniformities in recording, which degrades HAMR recording performance. Broadly, aspects of the present disclosure are directed to preventing or reducing mode hops, which serves to enhance HAMR recording performance. In some embodiments, preheating a laser diode cavity to a target temperature (i.e., nominal temperature used during the write operation) may help eliminate or minimize the temperature transient, as described in further detail below.

Figure 1B:
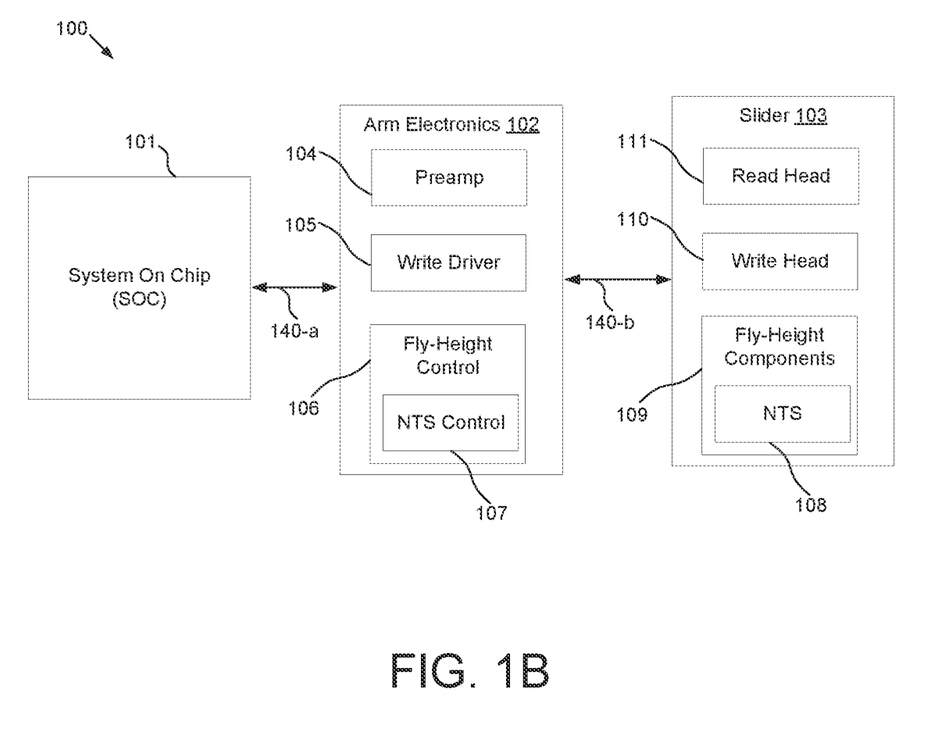
FIG. 1B shows a block diagram illustration of selected components of a disk drive, according to various aspects of the present disclosure.

As a disk rotates under a slider of a hard disk drive (HDD), the slider 103 is said to "fly" above the disk. In some cases, a thermal fly-height control (TFC) device (e.g., heater element) can be disposed within a slider (e.g., slider 103, slider 303) to contort the slider near the read and write transducers (or elements), which lowers the fly-height for the read and write transducers. In some examples, read and write elements or transducers reside in the slider of an HDD. In some cases, a disk drive may comprise fly-height control circuitry 106 that interfaces with fly-height components in the slider. Thermal fly-height control (TFC) is one prior art control technique that uses a heater element (not shown) disposed in the slider. The fly-height can be adjusted by heating the slider with the heater. Electrical current supplied to the heater by fly-height control circuitry 106 generates heat to thermally expand the slider and modulate the fly-height. The fly-height components 109 can also include other elements in addition to the heater. In some cases, the relative temperature at an air bearing surface (ABS) may be used to estimate the resistance, RRTD, of a resistive thermal detector (RTD), such as an embedded contact sensor (ECS) or a nearfield temperature sensor (NTS). Typically, the resistance of a material can be represented as a function of its intrinsic resistance and its dimensions (e.g., length, width, thickness or height). A fly-height control system can also include nearfield temperature sensors (NTS) 108 in the slider along the associated NTS control circuitry 107 in the arm electronics (AE) 102.

A disk drive 100 according to various aspects of the disclosure, as seen in FIG. 1B, comprises a system on a chip (SOC) 101, where the SOC 101 comprises the electronics and firmware for the drive and used to control the functions of the drive including providing power and/or control signals to the components shown in AE chip 102. Each disk (shown as disks 16A-D in FIG. 2B) can have thin film magnetic material on each of the planar surfaces. Each recording surface may comprise a dedicated pair of read and write heads packaged in a slider 103 that is mechanically positioned over the rotating disk by an actuator (e.g., shown as actuator assembly 19 in FIG. 2B). In some examples, the actuator(s) also provide the electrical connections to the slider 103 components. The actuator assembly 19 may also comprise the arm electronics (AE) chip 102, the AE 102 comprising preamps 104 (e.g., read or write preamp) for the heads (e.g., read head 111, write head 110), write driver 105 and fly-height controls 106. In some examples, the fly-height control circuit 106 includes an NTS control circuit 107, for example, when the disk drive employs heat assisted magnetic recording (HAMR). It is noted that some of the components shown in AE 102 can be implemented or partially implemented in SOC 101 according to various aspects.

As seen, a first connection (e.g., flex cable) 140-a connects the SOC 101 to the AE 102, while a second connection (e.g., flex cable) 140-b connects the AE 102 to the slider 103. The AE 102 typically include digital and analog circuitry that control the signals sent to components in the slider 103 and process the signals received from the slider 103 components. The AE 102 can include registers that are set using serial data from the SOC 101 to provide parameters for the AE functions. The write driver 105 generates an analog signal that is applied to an inductive coil in the write head 110 to write data by selectively magnetizing portions of the magnetic material on the surface of the rotating disk(s) 16.

As seen, slider 103 includes write head 110 configured to write data to a disk, a read head 111 configured to read data from the disk, fly-height components 109 configured to adjust slider fly-height (as described above) and resistive temperature detector (RTD), such as NTS 108, for sensing the temperature near the air-bearing surface (ABS). It is noted that ABS is generally used to describe the surface of the slider facing the disk, where the disk drive could be filled with gases other than air (e.g., gases containing helium, hydrogen, to name two non-limiting examples) and that the use of the "ABS" term to describe various aspects of the disclosure is not intended to limit the disclosure to air filled drives. In some cases, the NTS 108 is located proximate to the ABS and write head 110 (or alternatively the read head 111). The NTS 108 facilitates in detecting a temperature generated by the slider's proximity to the disk or media. In various embodiments, the NTS 108 may comprise a thermal strip (e.g., metallic or semiconductor strip) on the slider 103.

In some cases, a HAMR recording head (e.g., write head 110) also comprises optical components that direct light from a laser to the disk. During recording, a write element applies a magnetic field to a heated portion of the storage medium or disk, where the heat lowers the magnetic coercivity of the media, allowing the applied field to change the magnetic orientation of the heated portion. The magnetic orientation of the heated portion determines whether a one or a zero is recorded. Thus, by varying the magnetic field applied to the magnetic recording medium while it is moving, data can be encoded onto the medium. A HAMR drive uses a laser diode (LD) to heat the media to aid in the recording process. In some cases, the laser diode is disposed within a laser diode cavity and is proximate to a HAMR read/write element, where the read/write element has one end on the ABS of the slider 103. The ABS faces and is held proximate to a moving media surface during operation of the HDD.

Figure 4:
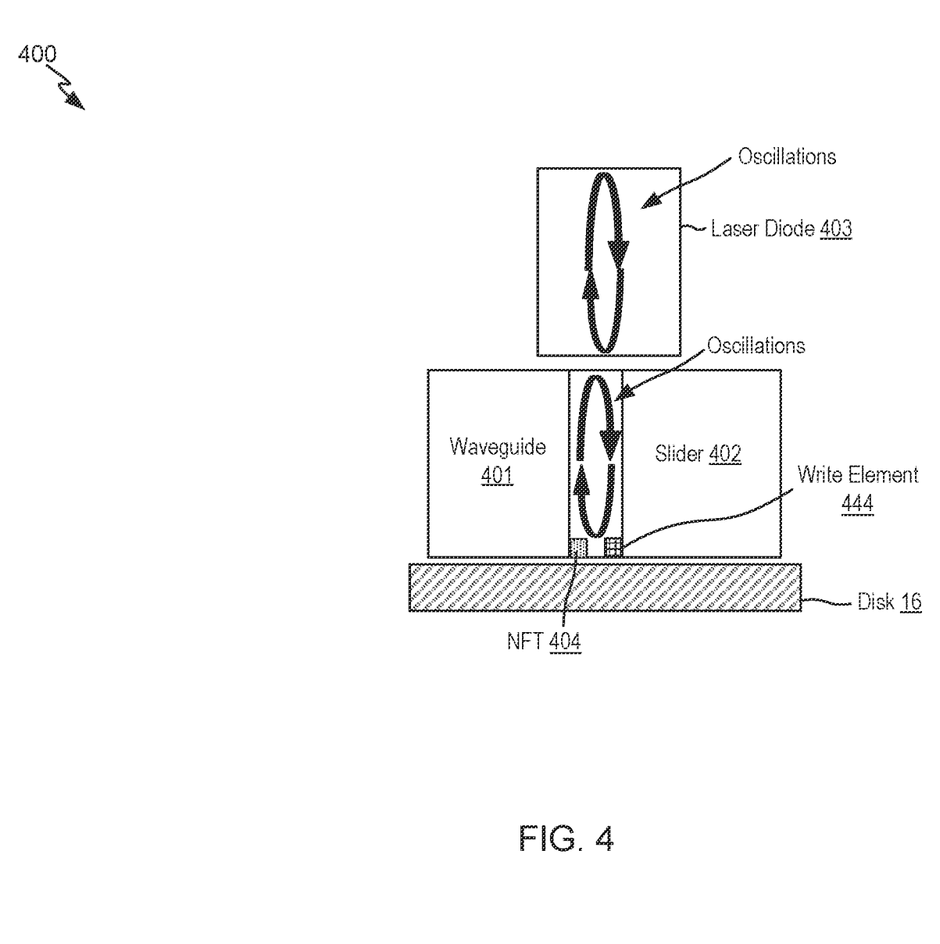
FIG. 4 illustrates a block diagram showing a waveguide, a laser diode, a disk, and a slider of a data storage device, according to various aspects of the present disclosure.

The laser diode (shown as laser diode 403 in FIG. 4) provides optical-based energy to heat the media surface, e.g., at a point near the read/write element. In some cases, optical path components, such as a waveguide 401, are formed integrally within the slider 402 to deliver light from the laser diode 403 to the media. For example, as shown in FIG. 4, a waveguide 401 and near field transducer (NFT) 404 may be located proximate a write element 444 to provide local heating of the media during write operations.

In some circumstances, various components (e.g., write element 444, NFT 404, LD 403, etc.) may experience significant heating due to light absorption and inefficiencies in electrical-to-optical energy conversion as energy produced by the LD 403 is delivered to the magnetic recording medium or disk 16. In some cases, for example, during the start of a write operation, the temperature of the LD experiences significant variations, causing a shift in laser emission wavelength. This in turn leads to a change of optical feedback from the optical path in the slider 402 to the LD cavity, resulting in mode hopping (i.e., power instability) of the LD 403. Mode hopping can degrade performance of HAMR drives, as mode hopping leads to shifting/jumping of laser output power and magnetic transition shifting between data blocks. Large transition shifts in data blocks may increase errors, degrading disk drive performance.

Figure 3:
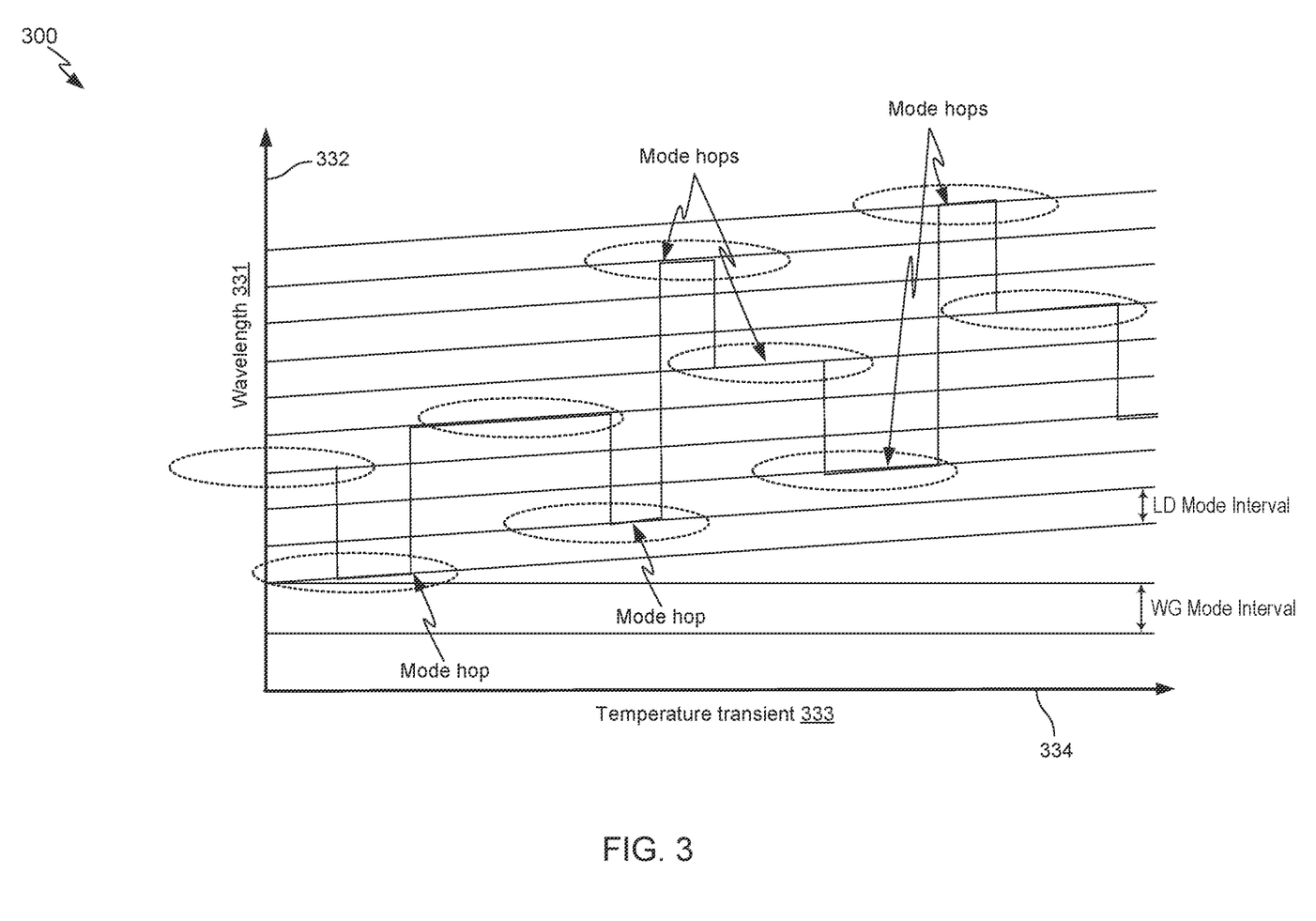
FIG. 3 illustrates a conceptual graph showing the relation between temperature transients, mode hop critical temperatures, and laser wavelength, according to various aspects of the present disclosure.

Turning now to FIG. 3, which illustrates a conceptual graph 300 of laser wavelength 331 (on vertical or y-axis 332) against temperature transient 333 (on horizontal or x-axis 334), according to various aspects of the present disclosure. Specifically, FIG. 3 depicts a conceptual graph showing how a laser "mode hops" when the temperature transient changes. As seen in FIG. 3, a laser may suddenly switch from operating in one resonator mode (e.g., producing energy with a first wavelength) to another mode (e.g., producing energy with a second, different wavelength) when the temperature transient equals a mode hop critical temperature. The laser then operates in the new resonator mode (e.g., producing energy with the second wavelength) for a range of temperature transients before switching to a different resonator mode (e.g., producing energy with a third wavelength).

Aspects of the present disclosure are directed to eliminating or minimizing the temperature transients by preheating a laser diode cavity to a target temperature (i.e., temperature used during the write operation), which serves to prevent mode hops and enhance HAMR recording performance.

Figure 2A:
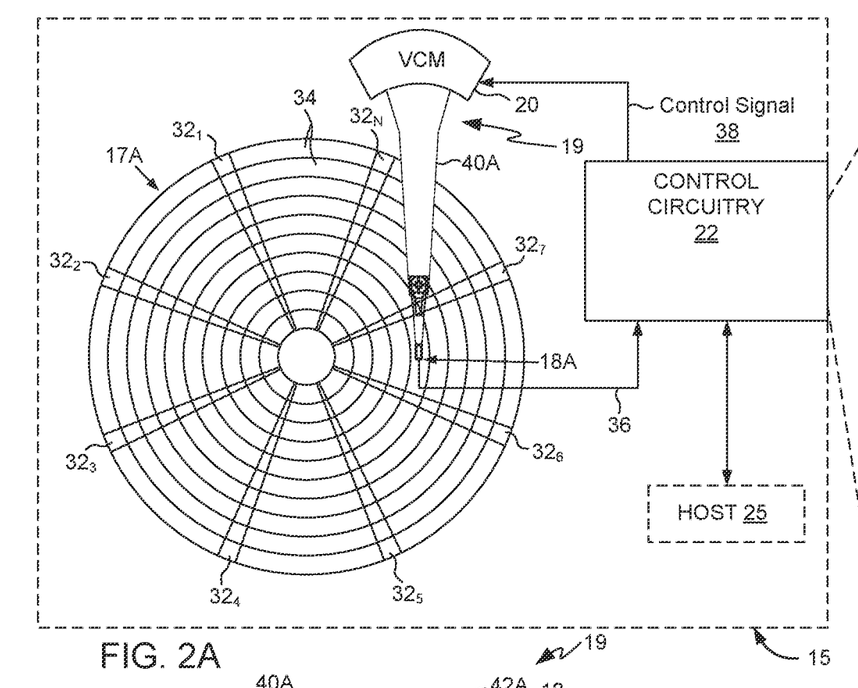
FIGS. 2A and 2B illustrate conceptual block diagrams of a top view and a side view of a data storage device in the form of a disk drive, according to various aspects of the present disclosure.
Figure 2B:
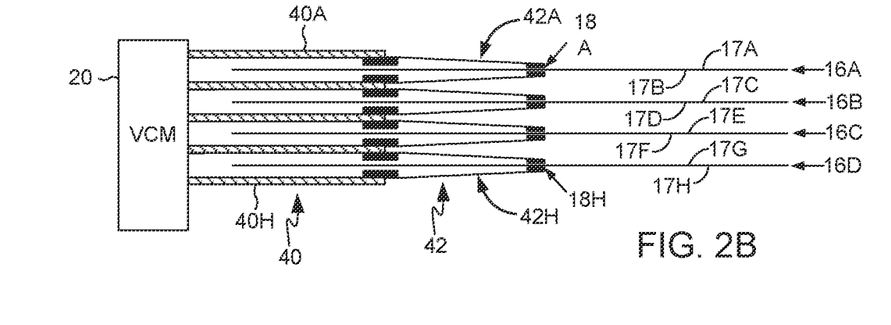
Figure 2C:
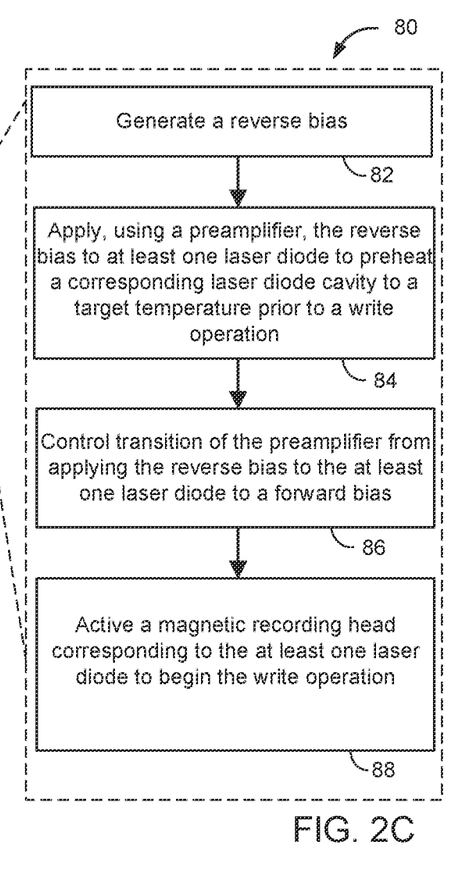
FIG. 2C illustrates a method that a data storage device may perform, execute, and implement, according to various aspects of the present disclosure.

Turning now to FIGS. 2A and 2B, which illustrate conceptual block diagrams of a top view and a side view of a data storage device in the form of a disk drive 15, in accordance with aspects of the present disclosure. Disk drive 15 comprises control circuitry 22, an actuator assembly 19, and a plurality of hard disks 16A, 16B, 16C, 16D ("hard disks 16," "disks 16"). FIG. 2C depicts a flowchart for an example method 80 that control circuitry 22 of disk drive 15 may perform or execute in controlling the operations of disk drive 15, including the operations of heads 18 (e.g., heads 18A-18H) disposed on actuator assembly 19, in accordance with aspects of the present disclosure, as further described below. Actuator assembly 19 thus comprises heads 18 and is configured to position the one or more heads 18 over disk surfaces 17 of the one or more disks 16. Heads 18 may each comprise write and read elements, configured for writing and reading control features and data to and from a corresponding disk surface 17 of hard disks 16.

Actuator assembly 19 comprises a primary actuator 20 (e.g., a voice coil motor ("VCM")) and a number of actuator arms 40 (e.g., topmost actuator arm 40A, as seen in the perspective view of FIGS. 2A and 2B). Each of actuator arms 40 comprises a head 18 at a distal end thereof (e.g., example head 18A comprised in topmost actuator arm 40A, in the view of FIGS. 2A and 2B). Each of actuator arms 40 is configured to suspend one of heads 18 in close proximity over a corresponding disk surface 17 (e.g., head 18A suspended by topmost actuator arm 40A over topmost corresponding disk surface 17A, head 18H suspended by lowest actuator arm 40H over lowest corresponding disk surface 17H). Various examples may include any of a wide variety of other numbers of hard disks and disk surfaces, other numbers of actuator arm assemblies and primary actuators besides the one actuator assembly 19 and the one primary actuator 20 in the example of FIGS. 2A and 2B, and other numbers of fine actuators on each actuator arm, for example.

FIG. 2A also depicts servo sectors 32 (e.g., servo sectors $32_1$ through $32_N$) written onto disk surfaces 17. In some cases, when manufacturing a disk drive, servo sectors 32 may be written to disk surfaces 17 to define a plurality of evenly-spaced, concentric tracks 34. As an example, each servo sector 32 may include a phase lock loop (PLL) field, a servo sync mark (SSM) field, a track identification (TKID) field, a sector ID, and a group of servo bursts (e.g., an alternating pattern of magnetic transitions) that the servo system of the disk drive samples to align the moveable transducer head (e.g., disk head 18) with and relative to, a particular track 34. Each circumferential track 34 includes a plurality of embedded servo sectors 32 utilized in seeking and track following. The plurality of servo sectors 32 are spaced sequentially around the circumference of a circumferential track 34 and extend radially outward from the inner diameter (ID) of disk surface 17. These embedded servo sectors 32 contain servo information utilized in seeking and track following and are interspersed between data regions on disk surfaces 17. Data is conventionally written in the data regions in a plurality of discrete data sectors. Each data region is typically preceded by a servo sector 32. Host 25 may be a computing device such as a desktop computer, a laptop, a server, a mobile computing device (e.g., smartphone, tablet, Netbook, to name a few non-limiting examples), or any other applicable computing device. Alternatively, host 25 may be a test computer that performs calibration and testing functions as part of the disk drive manufacturing processing.

In some examples, the control circuitry 22 is configured to control the actuation of the primary actuator (i.e., VCM). Further, the VCM is configured to actuate the head 18 over the disk surfaces 17. In some examples (80), the control circuitry 22 is also configured to generate a reverse bias (82); apply, by a preamplifier, the reverse bias to at least one laser diode of the data storage device to preheat at least one laser diode cavity to a target temperature prior to a write operation on one or more disks, wherein each of the at least one laser diode is positioned inside a corresponding laser diode cavity (84); control transition of the preamplifier from applying the reverse bias to the at least one laser diode to applying a forward bias (86); and begin the write operation, wherein the write operation comprises writing data to, or overwriting data on, the one or more disks of the data storage device (88).

In the embodiment of FIG. 2A, the control circuitry 22 may also process a read signal 36 emanating from the head $18_A$ to demodulate servo data written on the disk (e.g., servo sectors 32) to generate a position error signal (PES) representing an error between the actual position of the head and a target position relative to a target track. The control circuitry 22 may process the PES using a suitable servo control system to generate the control signal 38 (e.g., a VCM control signal) applied to the VCM 20 which rotates an actuator arm 40 about a pivot in order to actuate the head 18 radially over the disk surface 17 in a direction that reduces the PES. In one embodiment, the disk drive may also comprise a suitable microactuator, such as a suitable piezoelectric (PZT) element for actuating the head 18 relative to a suspension, or for actuating a suspension relative to the actuator arm 40.

In one embodiment, the servo data (e.g., servo sectors 32) read from the disk surface 17, i.e., in order to servo the head over the disk during access operations, may be self-written to the disk using the control circuitry 22 internal to the disk drive. In some examples, a plurality of spiral servo tracks are first written to the disk surface 17, and then servo sectors 32 are written to the disk while servoing on the spiral servo tracks. In order to write the spiral servo tracks to the disk surface 17, at least one bootstrap spiral track is first written to the disk without using position feedback from servo data (i.e., the actuator or VCM 20 is controlled open loop with respect to servo data on the disk). Before writing the bootstrap spiral track, feedforward compensation is generated by evaluating the BEMF voltage generated by the VCM 20 during a calibration seek (where the BEMF voltage represents an estimated velocity of the VCM). The bootstrap spiral track is then written to the disk using the feed-forward compensation. In some embodiments, the BEMF voltage representing the velocity of the VCM 20 may be sampled at any suitable sample rate in order to update the feed-forward compensation at any suitable frequency during seek operations.

FIG. 4 illustrates a block diagram 400 showing a waveguide (WG) 401, a laser diode (LD) 403, a disk 16, a near field transducer (NFT) 404, and a slider 402 of a data storage device, according to various aspects of the present disclosure. As seen, the WG 401 and the NFT 404 are located proximate a write element 444 to provide local heating of the media (i.e., disk 16) during write operations. In some cases, the LD 403 produces optical energy (e.g., having a wavelength between 700-900 nm), which is delivered to the magnetic recording medium or disk 16. In some examples, the LD 403 may be preheated prior to the start of a write operation by applying a reverse bias (or negative voltage) to the LD 403. The LD 403 may not emit laser light while the reverse bias is applied. In such cases, no data writing, rewriting, and/or erasure occurs. In this way, the laser cavity in which the LD 403 is positioned is preheated when the reverse bias is applied to the LD 403. To begin writing (or rewriting) data on the disk 16, the bias applied to the LD 403 is switched from a reverse bias to a forward bias. In some cases, the temperature of the LD 403 is configured to stay the same or substantially the same when the bias is switched to the forward bias, which serves to minimize the temperature transients, as compared to the prior art. In some aspects, reverse biasing of the LD 403 to preheat it before commencing the write operation facilitates enhanced control of the LD steady-state temperature, which helps avoid mode hops related to temperature transients at or near the start of a write operation. In some cases, the LD 403 is maintained in the pre-heat state before actually starting the write operation, which helps minimize or reduce laser-on transition time.

In some embodiments, the joule power dissipation selected for the reverse bias condition may be based on the expected joule power dissipation in the forward bias condition. For instance, the reverse bias joule power is selected based on the I-V characteristics of the LD 403 and the forward bias or operating joule power, as described below in relation to FIG. 6.

Figure 6:
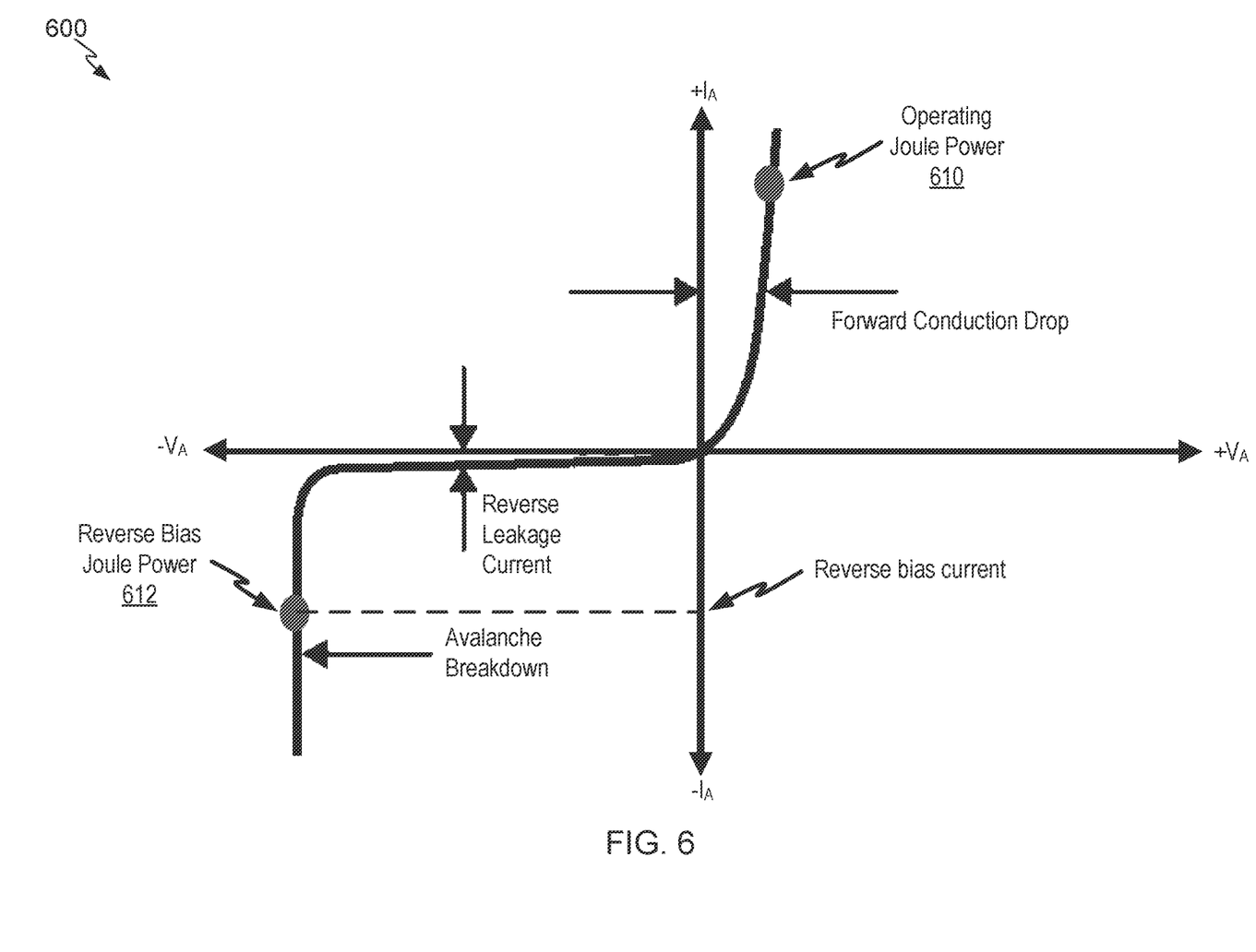
FIG. 6 illustrates an example of an I-V curve of a laser diode, including the joule powers dissipated in the forward and reverse bias modes, according to various aspects of the present disclosure.

FIG. 6 illustrates an example of an I-V curve 600 for a laser diode, such as LD 403, according to various aspects of the disclosure. Specifically, but without limitation, the I-V curve 600 in FIG. 6 depicts an example of the methodology used to select a joule power for preheating the laser diode, i.e., when the laser diode is in the reverse bias condition. As seen, in some embodiments, the reverse bias joule power 612 is selected based on the operating joule power 610 (i.e., the expected joule power when the laser diode is forward biased). Here, the reverse bias joule power 612, which can be calculated as the product of the reverse bias voltage and the reverse bias current, is equal to the operating joule power 610. Since the reverse bias voltage is equal to the avalanche or breakdown voltage of the LD, the reverse bias current can be calculated based on the reverse joule power 612 and the breakdown voltage (e.g., −10V, −15V, etc.).

When in the forward bias mode, the thermal signal (e.g., from ECS, NFT, which sense thermal changes) and the optical signal (e.g., from laser diode or photodiode) increase after the threshold current is exceeded. Additionally, when in the reverse bias mode, only the thermal signal (but not optical signal) increases, as expected, beyond the breakdown voltage of the laser diode. In some cases, when in the reverse bias mode, the current and power of the laser diode is controlled such that a maximum threshold current and power is not exceeded (i.e., the same as specified for the forward bias mode), which helps prevent the laser diode from damaging and/or degrading in the reverse bias mode.

Figure 7:
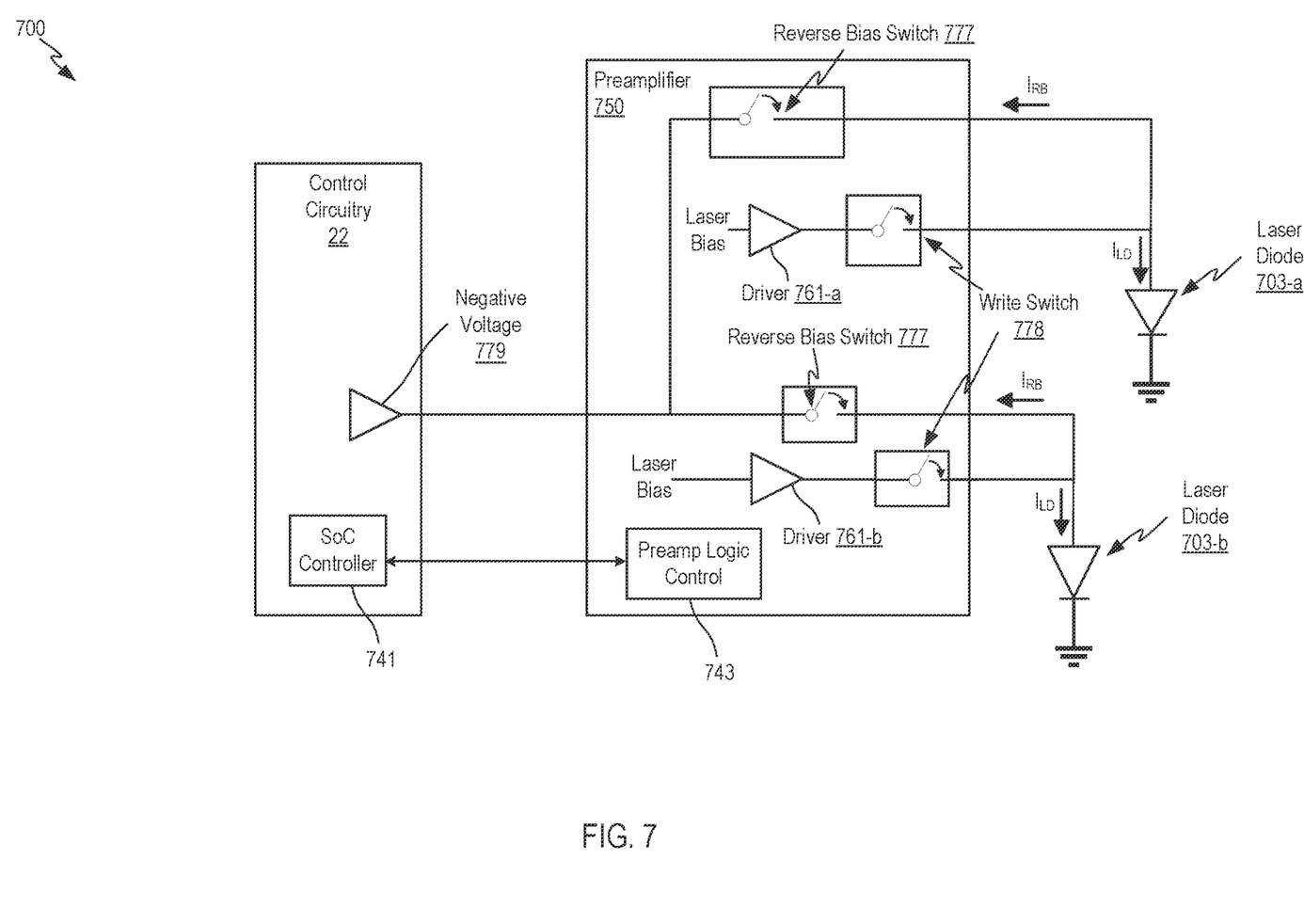
FIG. 7 is a block diagram showing some example components that may be used to effectuate reverse bias control of a laser diode, according to various aspects of the present disclosure.

FIG. 7 is a block diagram 700 showing some example components that may be used to effectuate reverse bias control of laser diode(s) of a HAMR data storage device, according to various aspects of the present disclosure. As seen, FIG. 7 shows the control circuitry 22 including a SOC controller 741, a preamplifier 750 having one or more LD drivers 761 (e.g., LD driver 761-a, LD driver 761-b), one or more laser diodes 703 (e.g., laser diode 703-a, laser diode 703-b), and one or more switches (e.g., shown as reverse bias switch 777, write switch 778). In some embodiments, the preamplifier 750 further includes an optional preamp logic control module 743 that is electronically and/or communicatively coupled to the SOC controller 741.

In some cases, the control circuitry 22 may be configured to generate a negative voltage 779 for reverse biasing the laser diode(s) 703. A reverse bias switch 777 in series connection to a corresponding laser diode may be closed to enable application of the negative voltage 779 to the LD 703. As noted above, when the laser diode(s) 703 are in reverse bias condition, they generate heat but do not emit laser light, which prevents data writing, overwriting, or erasures on the magnetic recording medium. In this way, the laser diode cavity (in which a laser diode is disposed) is preheated, which helps minimize temperature transients at or near the start of a write operation. In some cases, the control circuitry 22 (or alternatively the SOC controller 741) determines which head (not shown) the reverse bias voltage is applied to. In some embodiments, the preamplifier 750 comprises one or more internal multiplexers (muxes) to isolate the laser diode(s) 703 in reverse bias mode. Once the laser diode and laser diode cavity are preheated, the laser diode bias is switched from the reverse bias condition to the forward bias condition. In one non-limiting example, control circuitry 22 opens the reverse bias switch 777 coupled to a corresponding one of the laser diodes 703. Further, a forward bias (shown as laser bias) is applied and the write switch 778 in series connection with the driver 761 is closed, which causes a forward current (ILD) to flow through the laser diode 703.

In some embodiments, the laser diode 703 is switched from the reverse bias condition to a low power lasing condition (e.g., forward bias power is under a threshold to prevent data writing) for a brief duration before switching to the final operating mode (or final forward bias operating power), which facilitates fast turn on characteristics for the laser diode 703. That is, rather than switching directly from 100% reverse bias power to 100% forward bias power, a brief intermediate duration (e.g., a few nanoseconds) may be provided where the laser diode 703 is operated using a low power lasing condition.

Figure 5A:
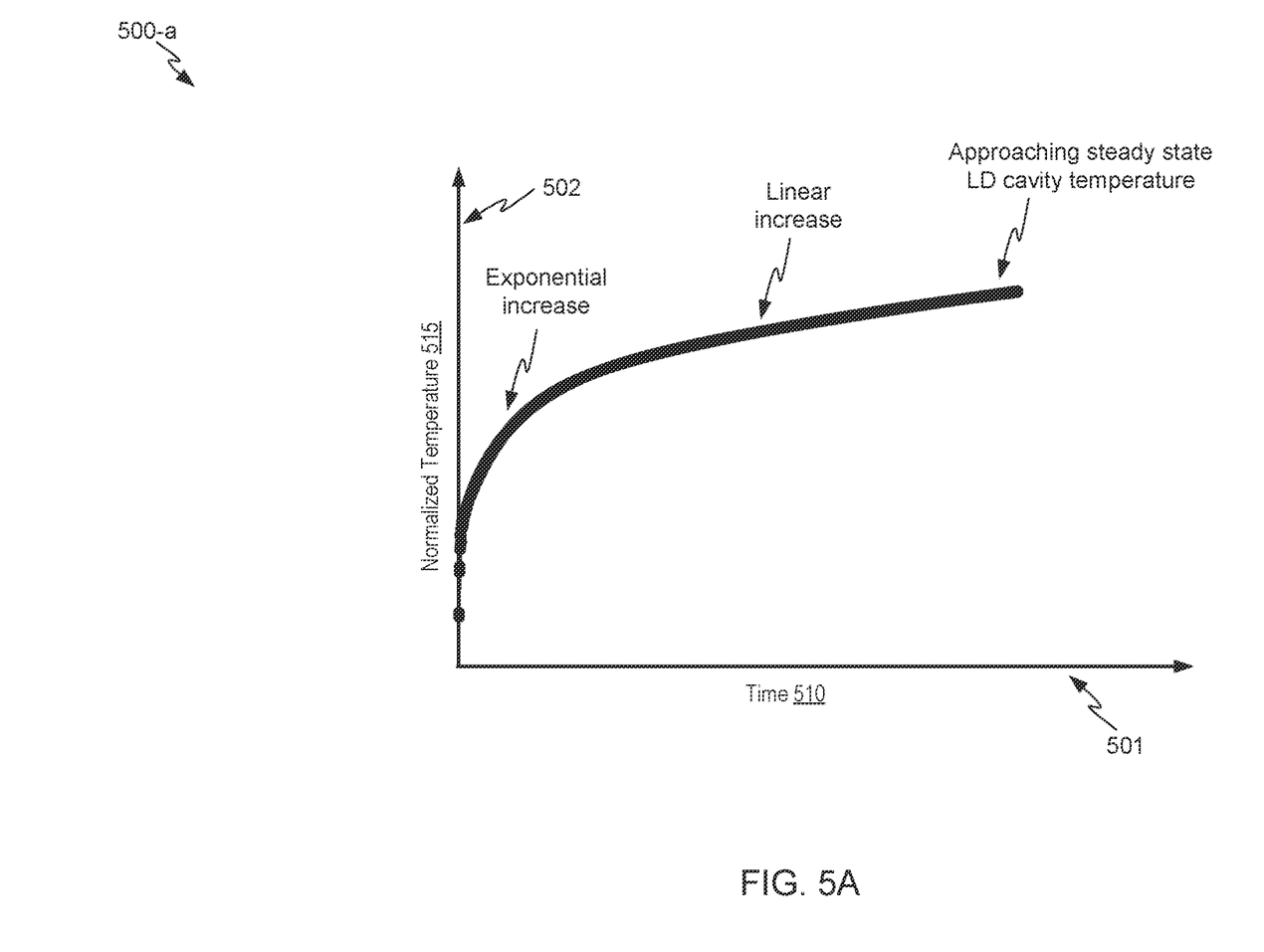
FIG. 5A illustrates a conceptual graph of laser diode cavity temperature against time during a write operation, according to various aspects of the present disclosure.

FIG. 5A illustrates a conceptual graph 500-a of normalized temperature 515 (on vertical or y-axis 502) of an LD cavity against time 510 (on horizontal or x-axis 501), according to various aspects of the present disclosure. As seen, the normalized temperature 515 of the LD cavity experiences a sharp/exponential increase when a forward bias is applied at or near the start of a write operation. After this exponential section, the normalized temperature curve increases in a linear fashion before the normalized temperature reaches a steady-state value. In some cases, the steady-state temperature is the nominal/operating temperature of the forward biased laser diode during the write operation. Aspects of the present disclosure are directed to preheating the laser diode cavity by applying a negative voltage (or reverse bias) to the laser diode, such that the temperature of the LD cavity (or LD) is at or near the steady-state temperature prior to the start of the write operation. In this way, the unwanted LD cavity temperature transients (i.e., shown by way of the exponential and linear increase portions of graph 500 in FIG. 5A) are avoided, which also helps avoid mod hops associated with the temperature transients at write start.

In some examples, the present disclosure may also support a "boost" or "overshoot" mode of operation, which further serves to reduce the LD cavity preheat time, as described below in relation to FIG. 5B.

Figure 5B:
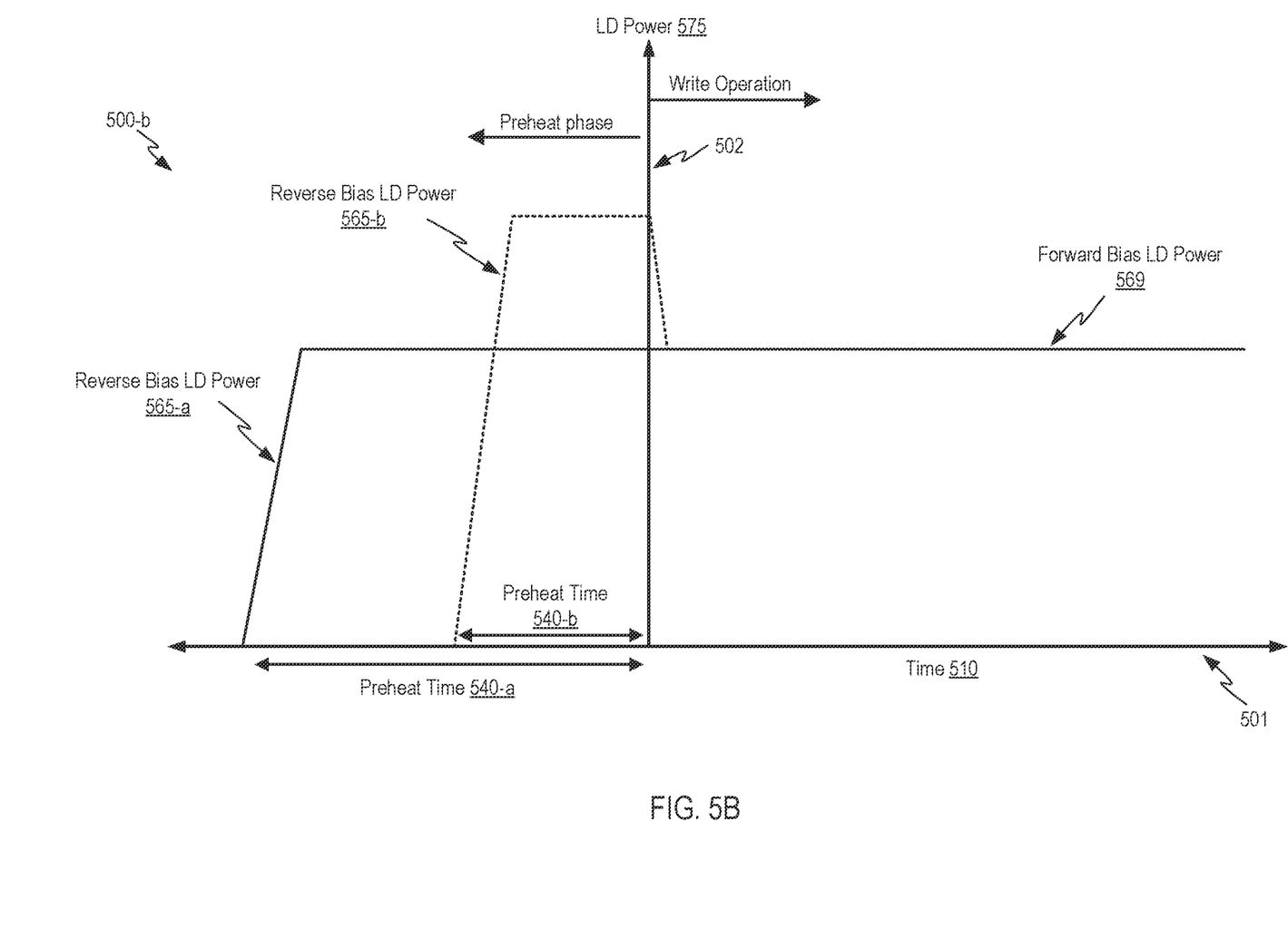
FIG. 5B illustrates a conceptual graph of laser diode power against time for both the preheat phase and the write phase of a laser diode of a data storage device, according to various aspects of the present disclosure.

FIG. 5B illustrates a conceptual graph 500-b of LD power 575 (on the vertical or y-axis 502) against time 510 (on the horizontal or x-axis 501), according to various aspects of the disclosure. Graph 500-b depicts a forward bias LD power 569 corresponding to the LD steady state temperature during the write phase (or write operation). In some examples, setting the reverse bias LD power to reverse bias LD power 565-a results in the required LD steady state temperature at the start of the write phase. In some cases, the reverse bias LD power 565-a (e.g., also shown as reverse bias joule power 612 in FIG. 6) is selected to be similar or substantially similar in magnitude to the forward bias LD power 569 (e.g., also shown as operating joule power 610). In some cases, an overshoot (or boosted) LD reverse bias power, shown as reverse bias LD power 565-b, can be applied to the LD during the pre-heat phase to reduce the pre-heat time, further described below.

In accordance with aspects of the disclosure, the preheat time may be reduced by selecting a higher joule power for the reverse bias condition, shown by way of reverse bias LD power 565-b. Specifically, reverse bias LD power 565-b corresponds to a higher joule power in reverse bias than the reverse bias LD power 565-a. As seen in FIG. 5B, the reverse bias LD power 565-a is applied for a first preheat time 540-a, where the preheat time corresponds to the time needed for the LD cavity to reach the required steady state temperature. Said another way, the first preheat time 540-a corresponds to the amount of time the LD spends in the reverse bias condition in order to ensure that it reaches the LD steady state temperature for the write phase. Furthermore, the reverse bias LD power 565-b is applied for a second preheat time 540-b, where the preheat time 540-b is of a shorter duration than the preheat time 540-a. That is, the reverse bias LD power 565-b serves to reduce the preheat time for achieving the same laser diode steady state temperature as the one achieved by applying the reverse bias LD power 565-*a* for a longer duration (i.e., preheat time 540-*a*).

Any suitable control circuitry (e.g., control circuitry 22 in FIG. 2A) may be employed to implement the flow diagrams in the above examples, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one example, the read channel and data storage controller are implemented as separate integrated circuits, and in another example, they are fabricated into a single integrated circuit or system on a chip (SOC), such as SOC 101 in FIG. 1B, SOC controller 741 in FIG. 7. In addition, the control circuitry 22 may include a preamp circuit, such as preamplifier 104 in FIG. 1B and/or preamplifier 750 in FIG. 7, where the preamp circuit is implemented as a separate integrated circuit, integrated into the read channel or data storage controller circuit, or integrated into an SoC.

In some examples, the control circuitry, such as, but not limited to, control circuitry 22, comprises a microprocessor executing instructions, the instructions being operable to cause the microprocessor to perform the flow diagrams (e.g., shown in FIG. 2C) described herein. The instructions may be stored in any computer-readable medium. In some examples, they may be stored on a non-volatile semiconductor memory device, component, or system external to the microprocessor, or integrated with the microprocessor in an SOC. In some examples, the instructions are stored on the disk and read into a volatile semiconductor memory when the disk drive is powered on. In some examples, the control circuitry comprises suitable logic circuitry, such as state machine circuitry. In some examples, at least some of the flow diagram blocks may be implemented using analog circuitry (e.g., analog comparators, timers, etc.), and in other examples at least some of the blocks may be implemented using digital circuitry or a combination of analog and digital circuitry.

In various examples, one or more processing devices may comprise or constitute the control circuitry 22 as described herein, and/or may perform one or more of the functions of control circuitry as described herein. In various examples, the control circuitry 22, or other one or more processing devices performing one or more of the functions of control circuitry as described herein, may be abstracted away from being physically proximate to the disks and disk surfaces. The control circuitry, or other one or more processing devices performing one or more of the functions of control circuitry as described herein, may be part of or proximate to a rack of or a unitary product comprising multiple data storage devices, or may be part of or proximate to one or more physical or virtual servers, or may be part of or proximate to one or more local area networks or one or more storage area networks, or may be part of or proximate to a data center, or may be hosted in one or more cloud services, in various examples.

In various examples, a disk drive, such as disk drive 15, may include a magnetic disk drive, an optical disk drive, a hybrid disk drive, or other types of disk drive. In addition, some examples may include electronic devices such as computing devices, data server devices, media content storage devices, or other devices, components, or systems that may comprise the storage media and/or control circuitry as described above.

The various features and processes described above may be used independently of one another or may be combined in various ways. All possible combinations and subcombinations are intended to fall within the scope of this disclosure. In addition, certain method(s), event(s), or process blocks may be omitted in some implementations. The methods and processes described herein are also not limited to any particular sequence, and the blocks or states relating thereto can be performed in other sequences. For example, described tasks or events may be performed in an order other than that specifically disclosed, or multiple may be combined in a single block or state. The example tasks or events may be performed in serial, in parallel, or in another manner. Tasks or events may be added to or removed from the disclosed examples. The example systems and components described herein may be configured differently than described. For example, elements may be added to, removed from, or rearranged compared to the disclosed examples.

While certain example embodiments are described herein, these embodiments are presented by way of example only, and do not limit the scope of the inventions disclosed herein. Thus, nothing in the foregoing description implies that any particular feature, characteristic, step, module, or block is necessary or indispensable. The novel methods and systems described herein may be embodied in a variety of other forms. Various omissions, substitutions and changes in the form of the methods and systems described herein may be made without departing from the spirit and scope of the present disclosure.

Method 80 and other methods of this disclosure may include other steps or variations in various other embodiments. Some or all of any of method 80 may be performed by or embodied in hardware, and/or performed or executed by a controller, a CPU, a field-programmable gate array (FPGA), a SOC, a multi-processor system on chip (MP-SOC), which may include both a CPU and an FPGA, and other elements together in one integrated SOC, or other processing device or computing device processing executable instructions, in controlling other associated hardware, devices, systems, or products in executing, implementing, or embodying various subject matter of the method.

Data storage systems, devices, and methods are thus shown and described herein, in various foundational aspects and in various selected illustrative applications, architectures, techniques, and methods for preheating laser diodes and/or laser diode cavities for data storage devices, such as HAMR drives, and other aspects of this disclosure. Persons skilled in the relevant fields of art will be well-equipped by this disclosure with an understanding and an informed reduction to practice of a wide panoply of further applications, architectures, techniques, and methods for preheating laser diodes and/or laser diode cavities for data storage devices, such as HAMR drives, and other aspects of this disclosure encompassed by the present disclosure and by the claims set forth below.

As used herein, the recitation of "at least one of A, B and C" is intended to mean "either A, B, C or any combination of A, B and C." The descriptions of the disclosed examples are provided to enable any person skilled in the relevant fields of art to understand how to make or use the subject matter of the present disclosure. Various modifications to these embodiments will be readily apparent to those skilled in the art based on the present disclosure, and the generic principles defined herein may be applied to other examples without departing from the spirit or scope of the disclosure. Thus, the present disclosure is not limited to the embodiments shown herein but is to be accorded the widest scope consistent with the principles and novel features disclosed herein.

The present disclosure and many of its attendant advantages will be understood by the foregoing description, and various changes may be made in the form, construction, and arrangement of the components without departing from the disclosed subject matter or without sacrificing all of its material advantages. The form described is merely explanatory, and the following claims encompass and include a wide range of embodiments, including a wide range of examples encompassing any such changes in the form, construction, and arrangement of the components as described herein.

While the present disclosure has been described with reference to various examples, it will be understood that these examples are illustrative and that the scope of the disclosure is not limited to them. All subject matter described herein are presented in the form of illustrative, non-limiting examples, and not as exclusive implementations, whether or not they are explicitly called out as examples as described. Many variations, modifications, and additions are possible within the scope of the examples of the disclosure. More generally, examples in accordance with the present disclosure have been described in the context of particular implementations. Functionality may be separated or combined in blocks differently in various examples of the disclosure or described with different terminology, without departing from the spirit and scope of the present disclosure and the following claims. These and other variations, modifications, additions, and improvements may fall within the scope of the disclosure as defined in the claims that follow.

What is claimed is:

1. A data storage device, comprising:
   one or more disks;
   an actuator arm assembly comprising one or more magnetic recording heads;
   at least one laser diode, each of the at least one laser diode positioned inside a corresponding laser diode cavity;
   a preamplifier; and
   one or more processing devices configured to:
      generate a reverse bias;
      apply, using the preamplifier, the reverse bias directly to the at least one laser diode to preheat a corresponding laser diode cavity to a target temperature prior to a write operation;
      control transition of the preamplifier from applying the reverse bias directly to the at least one laser diode to applying a forward bias to the at least one laser diode; and
      activate a magnetic recording head corresponding to the at least one laser diode to begin the write operation.

2. The data storage device of claim 1, wherein the preamplifier further comprises a reverse bias power control circuit coupled to the at least one laser diode and configured to apply the reverse bias to the at least one laser diode.

3. The data storage device of claim 1, wherein:
   no laser light is emitted when the reverse bias is applied to the at least one laser diode,
   no data writing or overwriting occurs when the reverse bias is applied to the at least one laser diode, or
   a temperature of a corresponding laser diode cavity is configured to stay the same or substantially the same after controlling the transition from the reverse bias to the forward bias for the at least one laser diode.

4. The data storage device of claim 1, wherein each of the at least one laser diode dissipates a first power during the preheating, and wherein each of the at least one laser diode dissipates a second power during the write operation.

5. The data storage device of claim 4, wherein:
   the first power is the same or substantially the same as the second power; or
   the first power is greater than the second power.

6. The data storage device of claim 1, wherein one or more mode hops related to temperature transients at or near a start of the write operation are avoided based at least in part on preheating a corresponding laser diode cavity to the target temperature.

7. The data storage device of claim 6, wherein the target temperature corresponds to a steady-state temperature associated with the write operation and when the at least one laser diode is in a lasing state.

8. The data storage device of claim 1, wherein the one or more processing devices are further configured to:
   maintain one or more of the at least one laser diode and a corresponding laser diode cavity in a preheat state such that a laser-on transition time is kept below a threshold.

9. The data storage device of claim 1, wherein applying the reverse bias comprises applying a negative voltage, and wherein a value of the negative voltage is kept below an avalanche or breakdown voltage for the at least one laser diode.

10. A method of operating a data storage device, the method comprising:
    generating a reverse bias;
    applying, by a preamplifier, the reverse bias directly to at least one laser diode of the data storage device to preheat at least one laser diode cavity to a target temperature prior to a write operation on one or more disks, wherein each of the at least one laser diode is positioned inside a corresponding laser diode cavity;
    controlling transition of the preamplifier from applying the reverse bias directly to the at least one laser diode to applying a forward bias to the at least one laser diode; and
    activating a magnetic recording head corresponding to the at least one laser diode to begin the write operation.

11. The method of claim 10, wherein:
    no laser light is emitted when the reverse bias is applied to the at least one laser diode,
    no data writing or overwriting occurs when the reverse bias is applied to the at least one laser diode, or
    a temperature of a corresponding laser diode cavity is configured to stay the same or substantially the same after controlling the transition from the reverse bias to the forward bias for the at least one laser diode.

12. The method of claim 10, further comprising:
    selecting a first power, wherein the first power corresponds to a power dissipated by each of the at least one laser diode during the preheating and when in a non-lasing state; and
    selecting a second power, wherein the second power corresponds to a power dissipated by each of the at least one laser diode during the write operation and when in a lasing state.

13. The method of claim 12, wherein one of:
    the first power is the same or substantially the same as the second power; or
    the first power is greater than the second power.

14. The method of claim 10, wherein one or more mode hops related to temperature transients at a start of the write operation are avoided based at least in part on preheating a corresponding laser diode cavity to the target temperature.

15. The method of claim 14, wherein the target temperature comprises a steady-state temperature associated with the write operation and when the at least one laser diode is in a lasing state.

16. The method of claim 10, further comprising:
maintaining one or more of the at least one laser diode and a corresponding laser diode cavity in a preheat state such that a laser-on transition time is kept below a threshold.

17. The method of claim 10, wherein applying the reverse bias comprises applying a negative voltage, and wherein a value of the negative voltage is kept below an avalanche or breakdown voltage for the at least one laser diode.

18. The method of claim 10, wherein the preamplifier comprises a reverse bias power control circuit coupled to the at least one laser diode and configured to apply the reverse bias to the at least one laser diode, and wherein the preamplifier further comprises one or more multiplexers for isolating the at least one laser diode during application of the reverse bias.

19. One or more processing devices comprising:
means for generating a reverse bias;
means for applying the reverse bias directly to at least one laser diode of a data storage device to preheat at least one laser diode cavity to a target temperature prior to a write operation on one or more disks, wherein each of the at least one laser diode is positioned inside a corresponding laser diode cavity;
means for controlling transition from applying the reverse bias directly to the at least one laser diode to applying a forward bias to the at least one laser diode; and
means for activating a magnetic recording head corresponding to the at least one laser diode to begin the write operation.

20. The one or more processing devices of claim 19, wherein the data storage device comprises a heat assisted magnetic recording (HAMR) data storage device, and wherein:
no laser light is emitted when the reverse bias is applied to the at least one laser diode,
no data writing or overwriting occurs when the reverse bias is applied to the at least one laser diode, or
a temperature of a corresponding laser diode cavity is configured to stay the same or substantially the same after controlling the transition from the reverse bias to the forward bias for the at least one laser diode.

* * * * *